United States Patent
Lee et al.

(10) Patent No.: US 6,881,992 B2
(45) Date of Patent: Apr. 19, 2005

(54) CMOS PIXEL DESIGN FOR MINIMIZATION OF DEFECT-INDUCED LEAKAGE CURRENT

(75) Inventors: Hae-Seung Lee, Bedford, MA (US); Keith Glen Fife, Cambridge, MA (US)

(73) Assignee: SMAL Camera Technologies, Cambridge, MA (US)

(*) Notice: Subject to any disclaimer, the term of this patent is extended or adjusted under 35 U.S.C. 154(b) by 0 days.

(21) Appl. No.: 10/244,723

(22) Filed: Sep. 16, 2002

(65) Prior Publication Data

US 2003/0052349 A1 Mar. 20, 2003

Related U.S. Application Data

(60) Provisional application No. 60/322,361, filed on Sep. 14, 2001.

(51) Int. Cl.[7] .................. H01L 29/768; H01L 31/062
(52) U.S. Cl. .................. 257/292; 257/59; 257/72; 257/222; 257/233; 257/291
(58) Field of Search .................. 257/59, 72, 222–223, 257/229, 233, 291–292, 333

(56) References Cited

U.S. PATENT DOCUMENTS

| | | | |
|---|---|---|---|
| 5,313,073 A | * | 5/1994 | Kuroda et al. .................. 257/18 |
| 5,614,744 A | | 3/1997 | Merrill |
| 6,040,592 A | * | 3/2000 | McDaniel et al. .......... 257/292 |
| 6,040,593 A | * | 3/2000 | Park .......................... 257/292 |
| 6,064,053 A | | 5/2000 | Chi |
| 6,069,376 A | | 5/2000 | Merrill |
| 6,177,293 B1 | | 1/2001 | Netzer et al. |
| 6,208,030 B1 | * | 3/2001 | Tsui et al. .................. 257/758 |
| 6,392,263 B1 | * | 5/2002 | Chen et al. .................. 257/292 |
| 6,545,258 B1 | * | 4/2003 | Tian et al. ................ 250/214.1 |

2001/0017367 A1 8/2001 Rotstein

OTHER PUBLICATIONS

Wolf, S. and Tauber, R.N., "Silicon Processing for the VLSI Era", vol. 1—Process Tecnology, Second Ed., Lattice Press, Sunset Beach, California (USA), ISBN 0–9616721–6–1 (2000).*

S. Gibilisco, "The Illustrated Dictionary of Electronics", Sixth Edition, TAB Books, McGraw–Hill, New York 1994 (ISBN: 0–07–023599–6), in particular pp. 634–644.*

* cited by examiner

*Primary Examiner*—Nathan J. Flynn
*Assistant Examiner*—Johannes Mondt
(74) *Attorney, Agent, or Firm*—Gauthier & Connors

(57) ABSTRACT

A pixel site of a semiconductor imager structure includes a substrate layer of a first dopant type; a photodiode being formed of a doped well region within the substrate layer, the doped well region being of a second dopant type; a transistor wherein a terminal of the transistor being provided within the doped well region, the terminal of the transistor being of the second dopant type and of a dopant concentration greater than a dopant concentration of the doped well region; and an oxide layer formed over the substrate layer, the doped well region, and the terminal of the transistor. The oxide layer has a varying height such that a height of the oxide layer associated with the doped well region is thicker than a height of the oxide layer associated with the terminal of the transistor. The oxide layer includes a step region being located where the height of the oxide layer transitions from the height associated with the doped well region to the height associated with the terminal of the transistor. The oxide layer has a constant height across a perimeter of the doped well region that forms a depletion region with the substrate when a reverse bias voltage is applied across thereto.

37 Claims, 11 Drawing Sheets

CMOS PIXEL DESIGN FOR MINIMIZATION OF DEFECT-INDUCED LEAKAGE CURRENT

CROSS-REFERENCE TO RELATED PROVISIONAL APPLICATION

The present patent application claims priority under 35 U.S.C. §119 from U.S. Provisional Patent Application Ser. No. 60/322,361 filed on Sep. 14, 2001. The entire contents of U.S. Provisional Patent Application Ser. No. 60/322,361 filed on Sep. 14, 2001 are hereby incorporated by reference.

BACKGROUND OF THE PRESENT INVENTION

CMOS image sensors are attractive for use in, e.g., still and video imaging applications, due to their compatibility with VLSI circuit design and fabrication processing. For many applications, a CMOS imager can be preferred over a corresponding CCD imager. Specifically, low-cost, large-scale CMOS design and fabrication technologies that have been developed for large-volume VLSI circuits can be directly employed in the production of CMOS imagers. CMOS imagers are, in general, much more cost effective than imagers produced based on CCD technologies.

In both CCD and CMOS imagers, imager pixels must hold, or maintain, image information produced by the pixels in the form of an electronic charge for a period of time that is typically on the order of about 10–100 milliseconds. Given this time scale, and due to the micron or submicron scale structure of CCD and CMOS pixels, any electronic leakage current generated at a pixel tends to substantially affect the image information maintained by the pixel, resulting in a distortion of the image produced by the imager.

This pixel leakage current, also referred to as "dark current," is understood to be due to the generation of electron-hole pairs in a depletion region where pixel charge is held. Leakage current can be caused by thermally generated holes and electrons and/or by material defects in the semiconductor substrate in which the pixels are fabricated.

Thermally-produced leakage current is a fundamental phenomenon that sets the minimum leakage current which generally can be attained by state-of-the-art pixel design. Leakage current produced by material defects can, however, be addressed and is found to be design-dependent.

Leakage current produced by material defects typically results from crystal dislocations in the silicon substrate in which the pixels are fabricated. Sites of crystal dislocations act as electron-hole pair generation centers that produce a corresponding current, known as a leakage current. As a result of the leakage current, a pixel can produce an output image signal even under dim or zero illumination conditions. Thus, for any input illumination, the leakage current contribution to the pixel output distorts the image, rendering the indicated illumination brighter than the true illumination.

At a very high leakage current, the pixel output can become saturated even under zero illumination conditions. In this situation, the pixel is completely unresponsive to varying scene illumination and produces only the saturation output level. In this case, the pixel is often termed "defective" and is effectively not operative for imaging applications.

It is understood that a reduction in pixel leakage current can be obtained by the reduction in the number of the dislocations in the crystal lattice of a silicon substrate in which a pixel is fabricated. Such dislocations can be formed in the substrate, near to the substrate surface, at locations of steps between a region of thin silicon dioxide and a region of thicker silicon dioxide provided on the substrate surface. At the boundary of a thin-oxide/thick-oxide step, mechanical stress is imposed on the silicon substrate, causing crystal lattice dislocations to form in the substrate, relatively close to the substrate surface.

If a crystal lattice dislocation in the silicon substrate is formed at a substrate location that falls within the extent of a photogenerated charge sensing depletion region of a CCD or CMOS pixel, or at the location of pixel regions that are electrically connected to, and thus at the same electrical potential as the photodiode region, that dislocation can act as an electron-hole pair generation center, as explained above, producing a contribution to pixel output that is not representative of input illumination. This leakage of current distorts the electronic charge maintained by the pixel and at high current levels, renders the pixel defective.

A requirement for control of pixel leakage current has been addressed in general in conventional CCD imager fabrication technologies, with a range of design and fabrication remedies developed to reduce pixel leakage current. High performance CCD imager technologies can maintain pixel dark current to a level as low as on the order of 20–100 $pA/cm^2$.

It is found, however, that in general, the minimum dark current obtainable by CMOS imager technologies is typically more than an order of magnitude greater than that obtainable by CCD imager technologies. In addition to being characterized by a larger average dark current than CCD imagers, CMOS imagers are in general found to be susceptible to a far larger number of defective pixels than CCD imagers.

While CCD imager technologies have been able to address the challenge of average dark current minimization and a reduction in number of defective pixels through fabrication process modifications, these CCD imager technologies require design or fabrication process modifications that are not, in general, cost effective or practical for CMOS imager technologies.

This is due to the fact that VLSI circuits produced by standard CMOS manufacturing processes, which are also employed for CMOS imagers, are largely unaffected by current leakage, and the principal advantage of CMOS imager technology is its use of such standard CMOS VLSI processing techniques. Any CMOS process modifications employed to reduce leakage current are therefore costly and inefficient, benefiting imager but not VLSI circuit applications.

The features of a CMOS pixel design layout that contribute to pixel leakage current can be illustrated with an example pixel design and corresponding fabrication layouts.

In FIG. 1, the operation of a CMOS active pixel 10 is described, using a schematic diagram of the pixel. This example pixel configuration employs a photodiode 11, but it is to be recognized that the pixel can include other light collecting configurations, embodied as, e.g., a phototransistor, a photogate, or other selected configuration.

As illustrated in FIG. 1, a photodiode 11 of the pixel produces a current of photo-generated electrical charge in response to light incident on the pixel. The resulting photocurrent is directed to a parasitic charge-sensing capacitor 13. The parasitic charge-sensing capacitor 13 is not an actual physical electrical element of a pixel, but the parasitic charge-sensing capacitor 13 represents the parasitic reverse-biased P-N junction capacitance and other parasitic capacitance associated with the photodiode 11.

A MOS transistor 15 operates as a source follower transistor that buffers the voltage on the parasitic charge-sensing capacitor 13 nondestructively to a column line 23 for read out of the voltage. Specifically, a row select MOS switch 17 activates the source follower transistor 15 when the particular row is selected, thereby enabling the parasitic charge-sensing capacitor voltage measurement. When the row select MOS switch 17 of the row is turned ON, a current source 24 is connected to the source of the MOS transistor 15. The MOS transistor 15 and the current source 24 operate as a source-follower configuration to buffer the voltage on the parasitic charge-sensing capacitor 13 to the column line 23 for determining the parasitic charge-sensing capacitor voltage at the end of an exposure period, to in effect measure the photo-generated electronic charge held by the pixel. A sense node 40 is the point in the circuit at which the parasitic charge-sensing capacitor voltage is electrically contacted for producing an output voltage to the column line 23.

FIG. 2 illustrates a top view of a conventional CMOS fabrication process layout for the pixel configuration of FIG. 1. FIG. 3 is a cross-sectional view of the conventional CMOS fabrication process layout taken at the section 3 of FIG. 2.

As illustrated in FIG. 2, the photodiode 11 is constructed between an n+ doped area 30 and a p-type substrate 41. The n+ doped area 30 acts as the cathode and the p-type substrate 41 as anode of the photodiode 11. The n+ doped area 30 is doped, typically by ion implantation, simultaneously with the doping of source and the drain areas (generally denoted as 33, 35, 37, and 39) of the NMOS transistors of the pixel.

With this configuration, the n+ cathode region of the photodiode 11 is extended out to form an n+ source 39 of the reset transistor 21 of FIG. 1. As illustrated in FIG. 2, the sense node contact 400 of the pixel is provided at the source location 39. Electrically, the n+ cathode area of the photodiode 11 as well as the source area 39 of the reset transistor 21 together form the sense node 40 of FIG. 1. The gate of the source follower transistor 15 is connected to the sense node 40 of FIG. 1 at the sense node contact point 400. The drain of the row select transistor 17 is connected to the source of the transistor 15 through n+ doped area 35.

In accordance with conventional CMOS fabrication processing, the p-type substrate 41, surrounding doped active device regions like the photodiode region 30 and the source and drain regions (33, 35, 37, and 39), is typically provided with a relatively thick silicon dioxide layer, known as the field oxide. The silicon dioxide layer in the p-type substrate 41 is about 2000–5000 in thickness.

The field silicon dioxide layer is provided with sufficient thickness to disable transistor action by polysilicon traces overlaying the oxide in their connection paths between various nodes of the transistors. In the areas forming the n+ source and drain areas, the gate areas, and the photodiode area, commonly referred to together as the "active area," the thick field silicon dioxide layer is inhibited and in place is provided a very thin oxide layer having a thickness corresponding to the prescribed gate oxide for the transistors.

As illustrated in FIG. 3, an example of CMOS process employing shallow trench isolation technology is shown. More specifically, as illustrated in FIG. 3, a step 43 in height between the field oxide layer 42 and the thinner oxide layer 44 overlaying the active area, including the n+ photodiode area 30, is shown in cross section. Under reverse bias conditions, a depletion region 50 is formed between the n+ photodiode area 30 and the p-type substrate 41, with the depletion region 50 extending deeper into the substrate than the photodiode area due to the lower doping level in the substrate relative to the photodiode area.

Dislocations 55 tend to form in the p-type substrate 41, near to the p-type substrate's surface, at a region near to where the step 43 in oxide height is located, due to mechanical stress imposed on the p-type substrate 41 by the step 43. Such dislocations, which will typically fall in the depletion region 50, act as electron-hole pair generation centers, producing a leakage current. The leakage current contribution to the pixel output is not based on pixel illumination, but instead on a dislocation generated current.

In the pixel layout of FIG. 2, the entire perimeter of the photodiode 30 and the region of the sense node contact 400; i.e., the entire perimeter of the photodiode area 30 as well as the reset transistor source area 39, where the sense node contact 400 is made, is characterized by a step in oxide layer thickness across the boundary of these regions.

As a result of this step in the oxide layer, the entire perimeter of the photodiode area 30 as well as the reset transistor source area 39 provides a region in which dislocations can form and excessive pixel leakage current can be produced. Thus, large average dark currents and a high density of defective pixels are typically found in CMOS imagers with this pixel layout.

FIG. 4 illustrates another conventional CMOS fabrication process layout for a pixel. In FIG. 4, the photodiode area 300 is not formed by the n+ doping implantation employed for the transistor source and drain regions 33, 35, 37, and 25. Instead, the photodiode 11 is formed simultaneously with the n-type doping of n-wells produced in the substrate for forming PMOS circuits. This n-well formation is a fabrication process step separate from the n+ source and drain formation, in a conventional manner. In the configuration illustrated in FIG. 4, the sense node contact 400 is provided at the reset transistor source region 25, and the photodiode 11 and the reset transistor source are connected by extending a portion of the reset transistor source region 25 of the transistor 21 into the n-well region 300 of the photodiode 11 by forming an n+ well in the n-well region 300 of the photodiode 11.

In an example process for fabricating the configuration illustrated in FIG. 4, the photodiode area 300 is doped with the n-well doping and is thereafter covered with a thick field oxide layer along with the field surrounding the areas defined for the transistors. The regions (33, 35, 37, and 25) for defining the pixel transistors are provided with a thin gate oxide layer. A step in oxide layer height also exists across the boundaries 70 and 72 of the reset transistor source region 25 in which the sense node contact 400 is provided. This height step across the boundaries 70 and 72 of the reset transistor source region 25, where the sense node contact 400 is formed, causes dislocations and a corresponding leakage current to be produced at the sense node 40.

The average dark current of a pixel having this layout is substantially reduced compared with the pixel design of FIG. 2 because there exists no thin-thick oxide boundary along the perimeter of the n-well photodiode area 300. However, since a thick-thin oxide step does exist at the perimeter of the reset transistor source region 25, where the sense node contact 400 is provided, dislocations do exist and hence excessive leakage current and defect pixel density are not completely eliminated.

Therefore, it is desirable to provide a pixel design and corresponding fabrication process that results in a CMOS pixel imager having substantially reduced leakage current.

As discussed above, since dislocations at step regions in the oxide layer are consistent by-products of the fabrication process, it is desirable to reduce the detrimental leakage current effect of these dislocations upon a CMOS pixel; namely, the effect upon the CMOS pixel's capability to convert illumination levels into a voltage properly; without removing or decreasing the number of dislocations.

It is further desirable to reduce the detrimental leakage current effect of the dislocations produced by the fabrication process without altering the standard fabrication process. It is desirable to reduce the detrimental leakage current effect of the dislocations produced by the fabrication process without requiring additional processing steps, additional backend processes, or non-standard process sequences.

Moreover, it is desirable to mask the detrimental leakage current effect of the dislocations produced by the fabrication process. Lastly, it is desirable to reduce the detrimental leakage current effect of the dislocations produced by the fabrication process by using a standard CMOS fabrication process that has not been modified with expensive fabrication steps.

SUMMARY OF THE PRESENT INVENTION

A first aspect of the present invention is a semiconductor structure. The semiconductor structure includes a substrate layer of a first dopant type; a doped well region provided within the substrate layer, the doped well region being of a second dopant type; a transistor wherein a terminal of the transistor being provided within the doped well region, the terminal of the transistor being of the second dopant type and of a dopant concentration greater than a dopant concentration of the doped well region; and an oxide layer formed over the substrate layer, the doped well region, and the terminal of the transistor. The oxide layer has a varying height such that a height of the oxide layer associated with the doped well region is thicker than a height of the oxide layer associated with the terminal of the transistor. The oxide layer includes a step region, the step region being located where the height of the oxide layer transitions from the height associated with the doped well region to the height associated with the terminal of the transistor. The oxide layer has a constant height across a perimeter of the doped well region that forms a depletion region with the substrate when a reverse bias voltage is applied across the substrate layer and the doped well region.

A second aspect of the present invention is a semiconductor imager structure. The semiconductor imager includes a substrate layer of a first dopant type and a well region provided within the substrate layer. The well region is of a second dopant type, wherein a depletion region is formed around a perimeter of the region when a reverse bias voltage is applied across the substrate layer and the well region. The well region is of a predetermined shape having a multitude of corners, a plurality of the corners of the well region being non-right angles.

A third aspect of the present invention is a pixel site of a semiconductor imager structure. The pixel site includes a substrate layer of a first dopant type; a photodiode being formed of a doped well region within the substrate layer, the doped well region being of a second dopant type; a transistor wherein a terminal of the transistor being provided within the doped well region of the photodiode, the terminal of the transistor being of the second dopant type and of a dopant concentration greater than a dopant concentration of the doped well region of the photodiode; and an oxide layer formed over the substrate layer, the doped well region of the photodiode, and the terminal of the transistor. The oxide layer has a varying height such that a height of the oxide layer associated with the doped well region of the photodiode is thicker than a height of the oxide layer associated with the terminal of the transistor. The oxide layer includes a step region, the step region being located where the height of the oxide layer transitions from the height associated with the doped well region of the photodiode to the height associated with the terminal of the transistor. The oxide layer has a constant height across a perimeter of the doped well region of the photodiode that forms a depletion region with the substrate when a reverse bias voltage is applied across the substrate layer and the doped well region of the photodiode.

A fourth aspect of the present invention is a pixel site of a semiconductor imager structure. The pixel site includes a photodiode formed in a substrate layer of a first dopant type; a first transistor connected to the photodiode; a second transistor connected to the first transistor; a sense node contact connected to the first and second transistors; and an oxide layer. The photodiode is provided as a well region formed within the substrate layer, the well region of the photodiode being of having a second dopant type. The first transistor includes a terminal being provided within the well region of the photodiode, the terminal of the first transistor being of the second dopant type and of a dopant concentration greater than a dopant concentration of the well region of the photodiode. The oxide layer is formed over the substrate layer, the well region of the photodiode, and the terminal of the first transistor. The oxide layer has a varying height such that a height of the oxide layer associated with the well region of the photodiode is thicker than a height of the oxide layer associated with the terminal of the first transistor. The oxide layer includes a step region, the step region being located where the height of the oxide layer transitions from the height associated with the well region of the photodiode to the height associated with the terminal of the first transistor. The oxide layer has a constant height across a perimeter of the well region of the photodiode that forms a depletion region with the substrate when a reverse bias voltage is applied across the substrate layer and the well region of the photodiode.

A fifth aspect of the present invention is a semiconductor imager structure. The semiconductor imager structure includes a substrate layer of a first dopant type; a photodiode, the photodiode region being provided as a well region formed within the substrate layer, the well region of the photodiode being of having a second dopant type; a transistor electrically connected to the photodiode and having a terminal that has a same electrical potential as the photodiode, the terminal of the transistor being of the second dopant type and of a dopant concentration greater than a dopant concentration of the well region of the photodiode; and an oxide layer. The well region of the photodiode has an extended portion so that at least a portion of the terminal of the transistor having the same electrical potential as the photodiode is formed within the extended portion of the well region of the photodiode. The oxide layer is formed over the substrate layer, the well region of the photodiode, and the terminal of the transistor. The oxide layer has a varying height such that a height of the oxide layer associated with the well region of the photodiode is thicker than a height of the oxide layer associated with the terminal of the transistor. The oxide layer includes a step region, the step region being located where the height of the oxide layer transitions from the height associated with the well region of the photodiode to the height associated with the terminal of the transistor. The oxide layer has a constant height across a perimeter of the well region of the photodiode that forms a depletion region with the substrate when a reverse bias voltage is applied across the substrate layer and the well region of the photodiode.

A sixth aspect of the present invention is a pixel site of a semiconductor imager structure. The pixel site includes a photodiode formed in a substrate layer of a first dopant type and a transistor connected to the photodiode. The photodiode is provided as a well region within the substrate layer, the well region being of a second dopant type, wherein a depletion region is formed around a perimeter of the well region when a reverse bias voltage is applied across the substrate layer and the well region. The transistor includes a source, a drain, and a gate, the source being provided as a region of source dopant in the well region. The source dopant is of the second dopant type and of a dopant concentration that is higher than a dopant concentration of the well, and the gate extends over a portion of the well region located between the source and drain regions.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
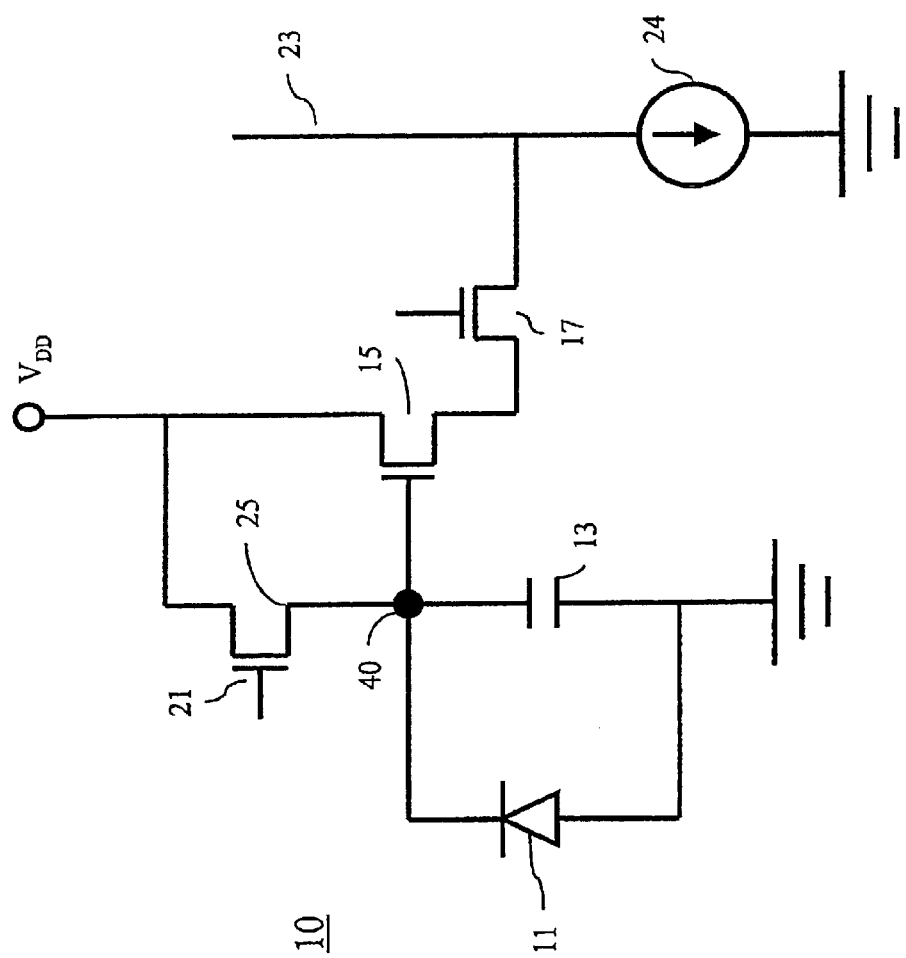
FIG. 1 is a conventional circuit diagram of a CMOS pixel.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

For purposes of describing the present invention, the term "well region" is being used to describe a doped substrate region in which a shallower doped region can be formed. A well region, for the purposes of describing the present invention, is not limited only to a region where transistors are built. A well region, as used in describing the concepts, features, and advantages of the present invention, has a broader meaning in that it is a region within a substrate wherein a dopant is provided typically extending from the substrate surface down to a typically relatively deep depth into the substrate, wherein the region also can include a shallow doped region therein. With respect to the present invention, the well region may be formed from an n-type dopant or a p-type dopant.

Moreover, for purposes of describing the present invention, the term "within the well region" is being used to describe a location of a shallower concentrated-doped region with respect to a doped well region. Within the well region, for the purposes of describing the present invention, may indicate that the doped well region substantially surrounds the shallower concentrated-doped region. Within the well region, for the purposes of describing the present invention, may also indicate a shallower concentrated-doped region located within a doped well region wherein one or more of the edges of the shallower concentrated-doped region actually coincide or line-up with one or more of associated edges of the doped well region. In other words, according to the concepts of the present invention, the final fabrication of a shallower concentrated-doped region provided within a doped well region may result in the doped well region substantially surrounding the shallower concentrated-doped region or the doped well region surrounding a portion of the shallower concentrated-doped region wherein one or more of the edges of the shallower concentrated-doped region coincide or line-up with one or more of associated edges of the doped well region. The edge or edges of the doped well region do not need to extend beyond an associated edge of the shallower concentrated doped region to be realized as being within the doped well region, according to the concepts of the present invention.

Figure 5:
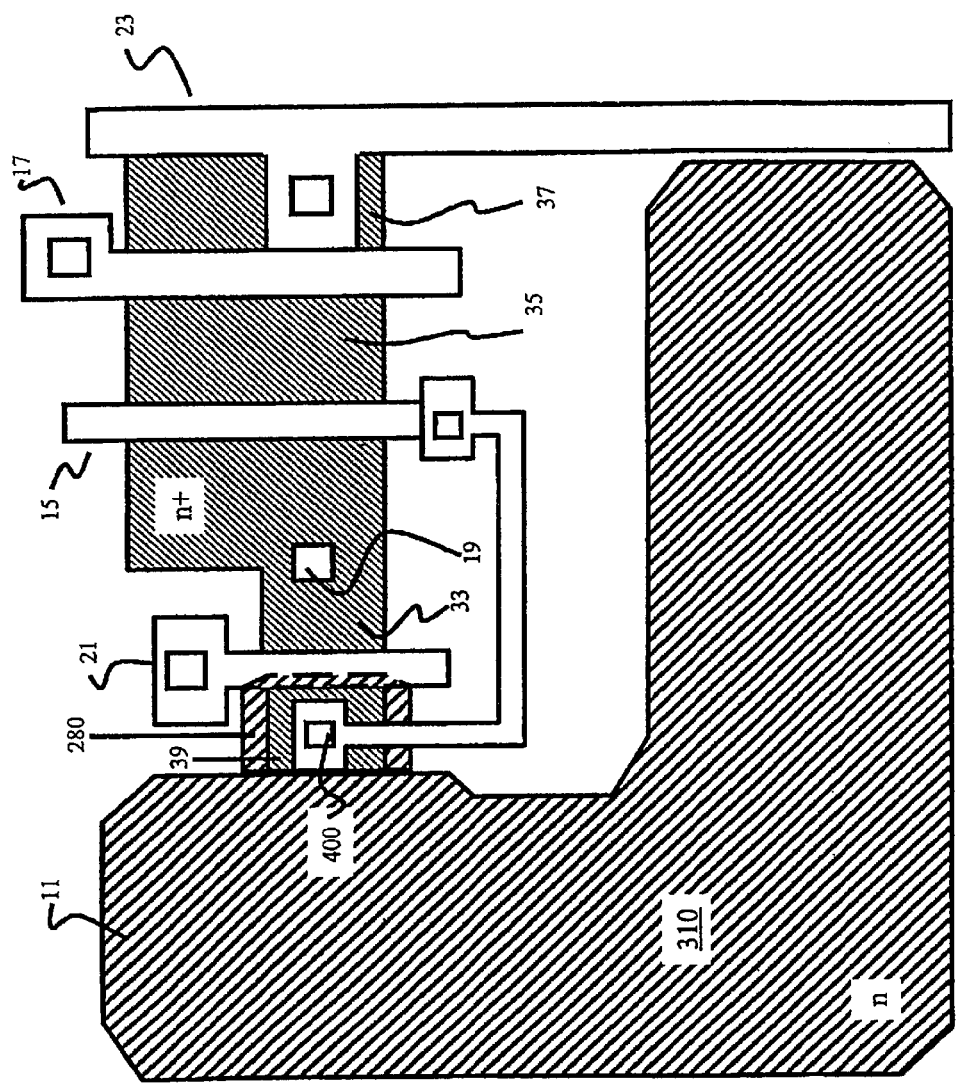
FIG. 5 is one embodiment of a CMOS fabrication process layout for a pixel according to the concepts of the present invention.

A first embodiment of a CMOS fabrication process layout for a pixel according to the concepts of the present invention is illustrated in FIG. 5. As illustrated in FIG. 5, an n-type area 310, defining a photodiode region 11, is provided for forming a P-N junction with a p-type substrate 41. This n-well region 310 can be formed by doping the region simultaneously with the doping step employed to produce n-wells in the substrate for fabricating PMOS circuits and thus no additional fabrication steps need to be added to a standard CMOS fabrication process.

A surrounding field area of the p-type substrate 41 and the n-type photodiode area 310 are covered with a thick field oxide layer. As a result, no oxide layer height step exists across the boundary at a perimeter of the photodiode area 310 where a depletion region can be formed. The perimeter of the photodiode area 310 is where a P-N junction with the p-type substrate is located, and thus, a depletion region will form when a reverse bias voltage is applied across the P-N junction.

The source and drain regions 33, 35, 37, and 39 of the transistors (21, 15, and 17) are doped n+ in a conventional manner. The n+ source region 39 of the reset transistor 21 is configured to electrically contact the photodiode 11 by being located contiguously with the n-well region 310.

Figure 2:
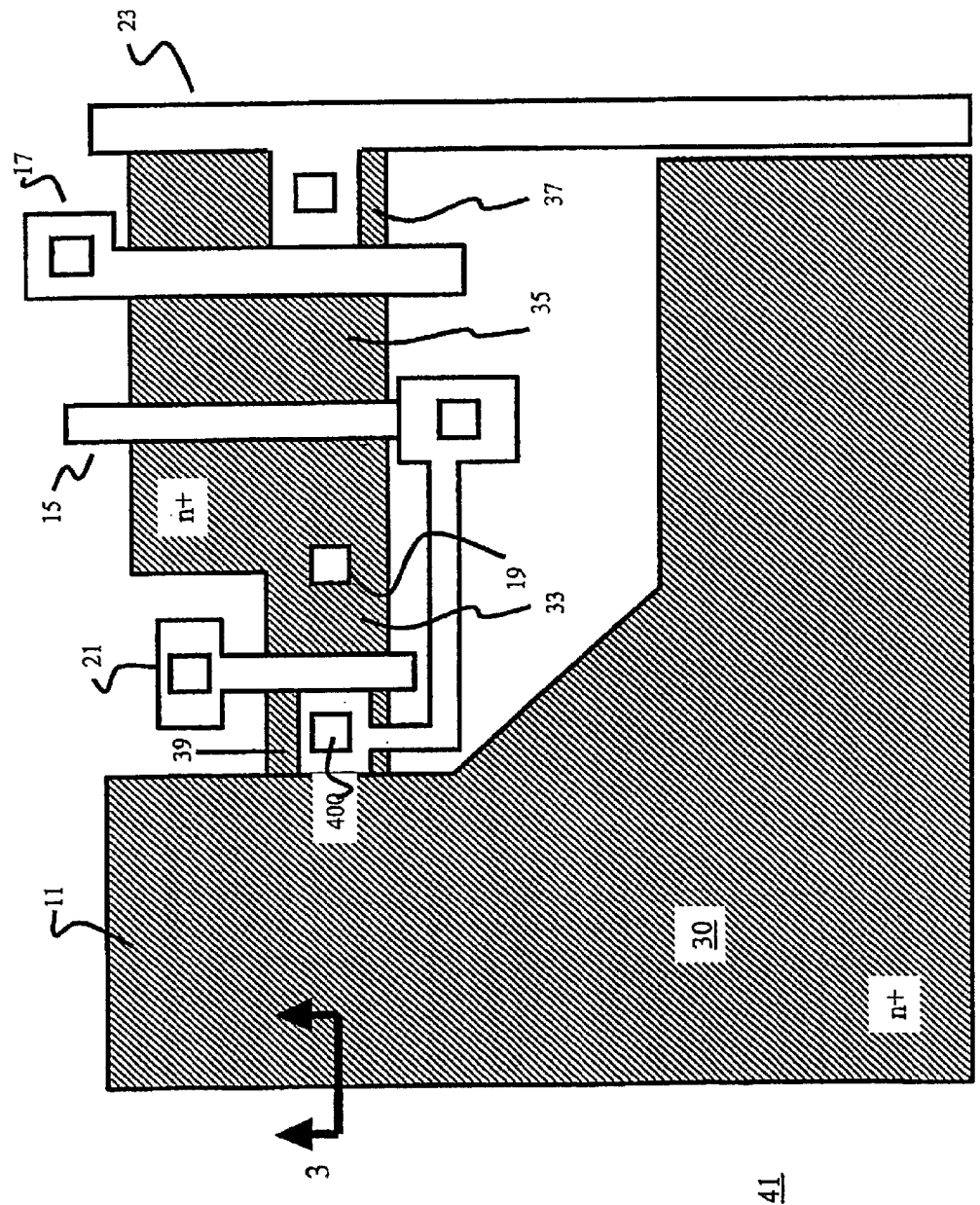
FIG. 2 is a conventional CMOS fabrication process layout for the pixel of FIG. 1.

However, unlike the conventional layout of the photodiode 11 as illustrated in FIG. 2, the photodiode area 310 is extended out, as represented by portion 280 in FIG. 5, to substantially surround the n+ source region 39 of the reset transistor 21 and to also extend partially under the gate of reset transistor 21. By substantially surrounding the n+ source region 39 of the reset transistor 21 and by also extending partially under the gate of reset transistor 21 with the extended photodiode area portion 280, a continuous oxide layer thickness with no step across the boundary or perimeter region of the photodiode 11 or a terminal of a transistor having the same dopant type and the same electrical potential as the photodiode 11 is realized. It is noted that the source and drain region 33 includes a contact 19 to provide a connection to voltage $V_{DD}$.

As noted above, the oxide layer which overlays all these regions is thinner at regions of concentrated dopant, such as the n+ dopant source region 39, thereby forming a step in the oxide layer when the oxide layer transitions from region of relatively low dopant concentration to a region having a higher concentration of dopant. This step causes material defects, such as crystal dislocations, which generate unwanted leakage current when the dislocations are at locations that fall within the depletion region.

By forming a tub region from the n-well photodiode area 310 around the n+ dopant source region 39, the present invention is able to isolate the formation of the crystal dislocations in an area of the substrate that is not associated with the depletion region of the n-well photodiode area 310 and the substrate.

In other words, the oxide layer of FIG. 5 has a varying height such that a height of the oxide layer associated with the well region of the photodiode 310 is thicker than a height of the oxide layer associated with the terminal 39. The oxide layer includes a step region wherein the step region is formed where the height of the oxide layer transitions from the height associated with the photodiode well region 310 to the height associated with the terminal 39. The oxide layer has a constant height across a perimeter of the well region of the photodiode 310 that forms a depletion region with the substrate 41 when a reverse bias voltage is applied across the substrate layer 41 and the well region of the photodiode 310.

Another feature of the present invention as illustrated in FIG. 5, is the shape of the n-well photodiode area 310. As illustrated in FIG. 5, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

It is noted that FIG. 5 is an example of where n+ dopant source region 39, a terminal of the reset transistor 21, is formed contiguously with or immediate adjacent to provide an electrical connection with the photodiode 11. In this embodiment, the photodiode n-well region 310 includes the extended portion 280 so that the step associated with the n+ dopant source region 39 is not associated with the depletion region of the n-well photodiode area 310 and the substrate. This extended portion 280 can be formed by doping the region simultaneously with the doping step employed to produce n-wells in the substrate for fabricating PMOS circuits and thus no additional fabrication steps need to be added to a standard CMOS fabrication process.

Figure 6:
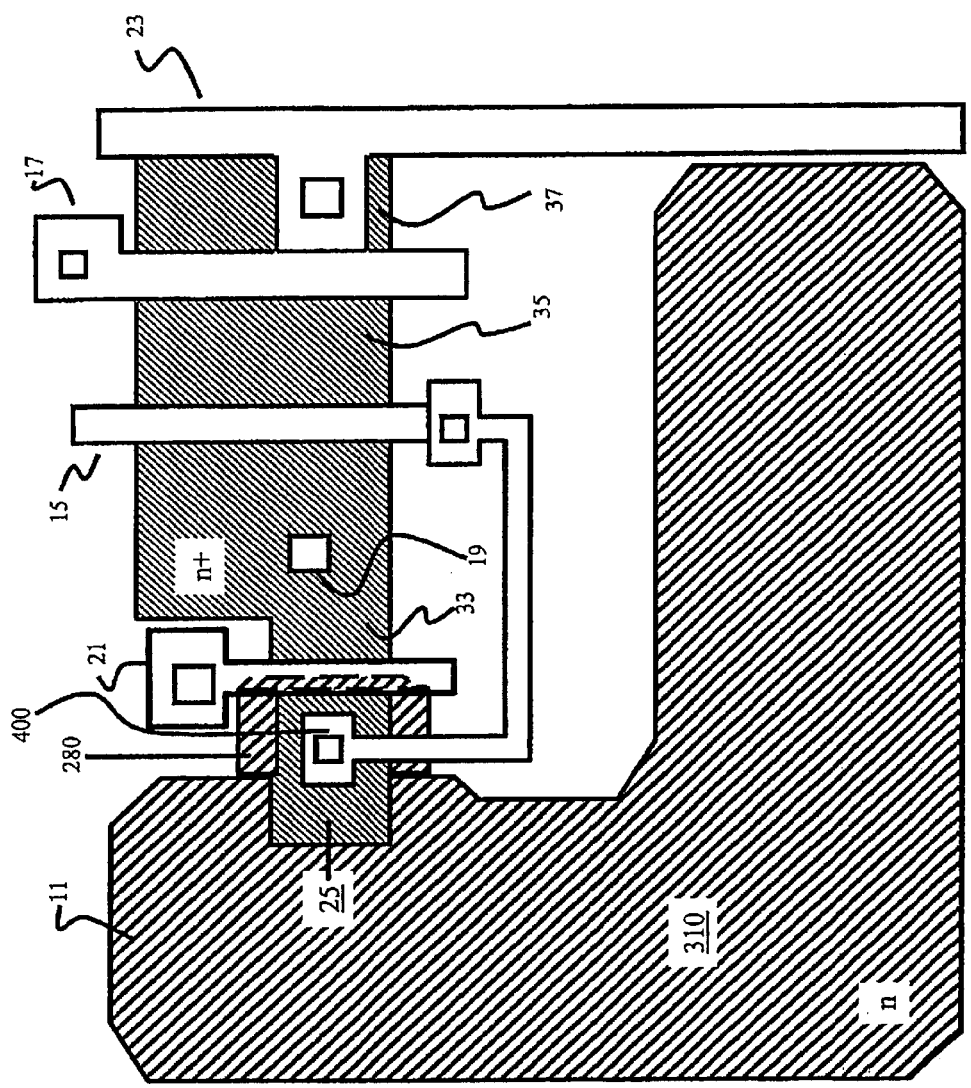
FIG. 6 is a second embodiment of a CMOS fabrication process layout for a pixel according to the concepts of the present invention.

Another embodiment of a CMOS fabrication process layout for a pixel according to the concepts of the present invention is illustrated in FIG. 6. As illustrated in FIG. 6, an n-type area 310, defining a photodiode region 11, is provided for forming a P-N junction with a p-type substrate 41. This n-well region can be formed by doping the region simultaneously with the doping step employed to produce n-wells in the substrate for fabricating PMOS circuits and thus no additional fabrication steps need to be added to a standard CMOS fabrication process.

A surrounding field area of the p-type substrate 41 and the n-type photodiode area 310 are covered with a thick field oxide layer. As a result, no oxide layer height step exists across the boundary at a perimeter of the photodiode area 310 where a depletion region can be formed. The perimeter of the photodiode area 310 is where a P-N junction with the p-type substrate is located, and thus, a depletion region will form when a reverse bias voltage is applied across the P-N junction.

The source and drain regions 25, 33, 35, and 37 of the transistors (21, 15, and 17) are doped n+ in a conventional manner. The n+ source region 25 of the reset transistor 21 is configured to electrically contact the photodiode 11 by extending a portion of the source region 25 into the n-well photodiode area 310.

Figure 4:
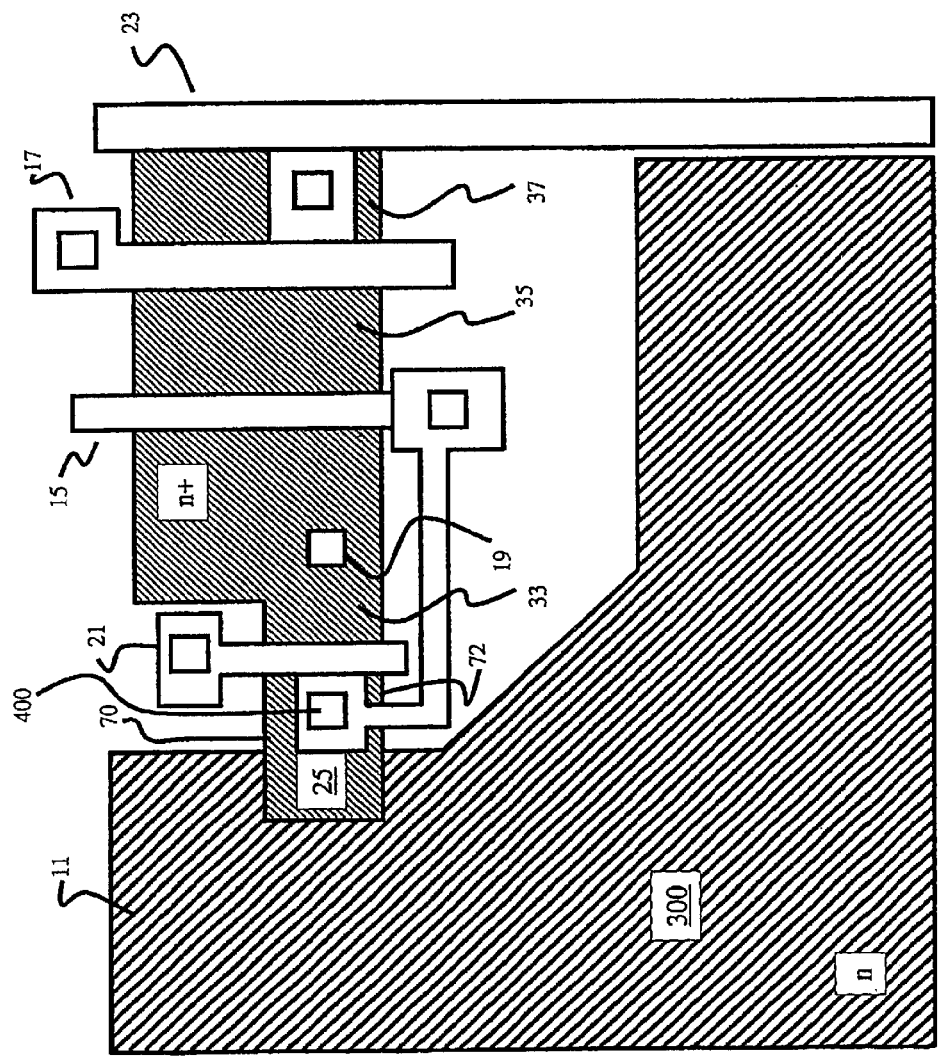
FIG. 4 another conventional CMOS fabrication process layout.

However, unlike the conventional layout of the photodiode 11 as illustrated in FIG. 4, the photodiode area 310 is extended out, as represented by portion 280 in FIG. 6, to substantially surround the n+ source region 25 of the reset transistor 21 and to also extend partially under the gate of reset transistor 21. By substantially surrounding the n+ source region 25 of the reset transistor 21 and by also extending partially under the gate of reset transistor 21 with the extended photodiode area portion 280, a continuous oxide layer thickness with no step across the boundary or perimeter region of the photodiode 11 or a terminal of a transistor having the same dopant type and the same electrical potential as the photodiode 11 is realized. It is noted that the source and drain region 33 includes a contact 19 to provide a connection to voltage $V_{DD}$.

As noted above, the oxide layer which overlays all these regions is thinner at regions of concentrated dopant, such as the n+ dopant source region 25, thereby forming a step in the oxide layer when the oxide layer transitions from region of relatively low dopant concentration to a region having a higher concentration of dopant. This step causes material defects, such as crystal dislocations, which generate unwanted leakage current when the dislocations are at locations within the depletion region.

By forming a tub region from the n-well photodiode area 310 around the n+ dopant source region 25, the present invention is able to isolate the formation of the crystal dislocations in an area of the substrate that is not associated with the depletion region of the n-well photodiode area 310 and the substrate.

In other words, the oxide layer of FIG. 6 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

Another feature of the present invention as illustrated in FIG. 6, is the shape of the n-well photodiode area 310. As illustrated in FIG. 6, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

It is noted that FIG. 6 is an example of where n+ dopant source region 25, a terminal of the reset transistor 21, is formed partially within the photodiode 11 to provide an electrical connection with the photodiode 11. In this embodiment, the photodiode n-well region 310 also includes the extended portion 280 so that the step associated with the n+ dopant source region 25 is not associated with the depletion region of the n-well photodiode area 310 and the substrate. This extended portion 280 can be formed by doping the region simultaneously with the doping step employed to produce n-wells in the substrate for fabricating PMOS circuits and thus no additional fabrication steps need to be added to a standard CMOS fabrication process.

Figure 7:
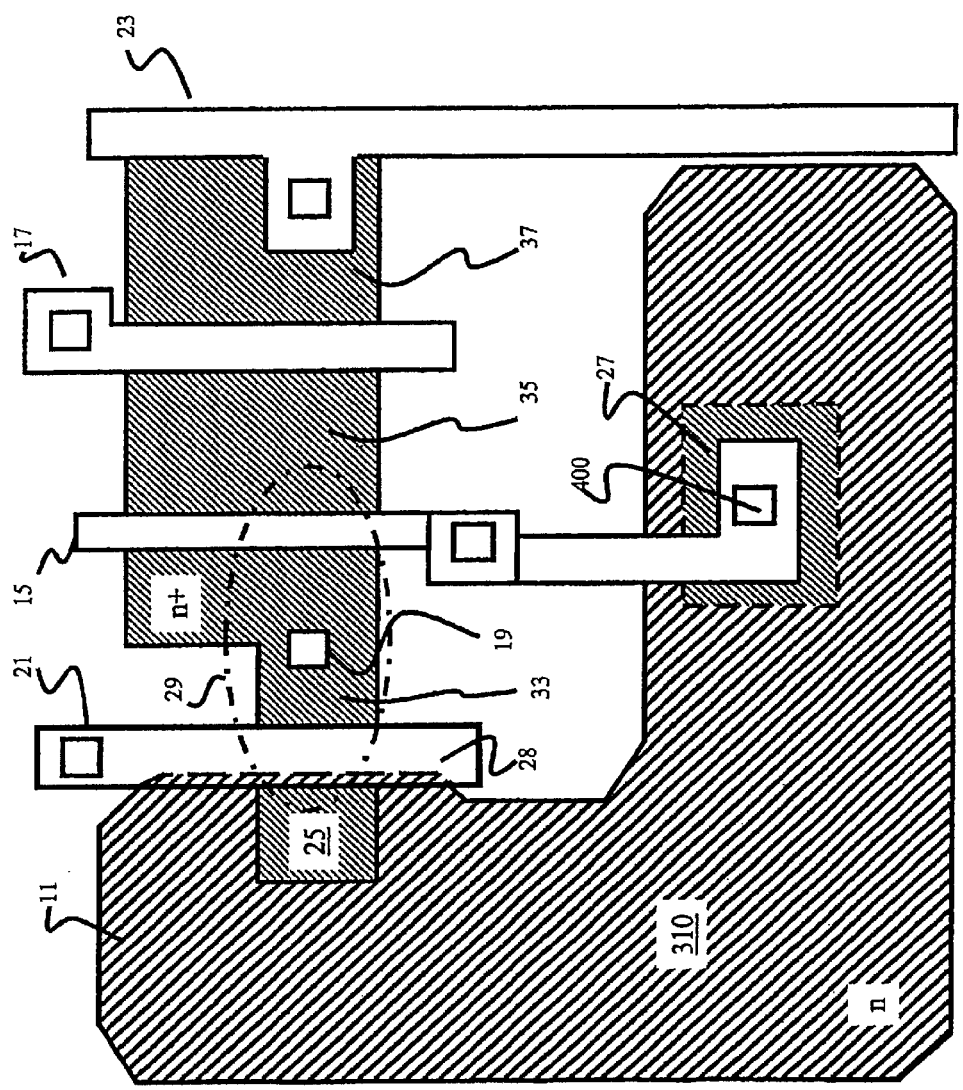
FIG. 7 is a third embodiment of a CMOS fabrication process layout for a pixel according to the concepts of the present invention.

A further embodiment of a CMOS fabrication process layout for a pixel according to the concepts of the present invention is illustrated in FIG. 7. As illustrated in FIG. 7, an n-type area 310, defining a photodiode region 11, is provided for forming a P-N junction with a p-type substrate 41. This n-well region can be formed by doping the region simultaneously with the doping step employed to produce n-wells in the substrate for fabricating PMOS circuits and thus no additional fabrication steps need to be added to a standard CMOS fabrication process.

A surrounding field area of the p-type substrate 41 and the n-type photodiode area 310 are covered with a thick field oxide layer. As a result, no oxide layer height step exists across the boundary at a perimeter of the photodiode area 310 where a depletion region can be formed. The perimeter of the photodiode area 310 is where a P-N junction with the p-type substrate is located, and thus, a depletion region will form when a reverse bias voltage is applied across the P-N junction.

In this embodiment, an n+ source region 25 is located within the photodiode region 11 such that a portion of the outer perimeter or boundary of the photodiode region 11, represented by the dashed line 28 in FIG. 7, actually extends partially under the gate of reset transistor 21. The boundary or perimeter region of the photodiode 11 has a continuous oxide layer thickness thereupon with no step across the boundary or perimeter region of the photodiode 11. Thus, the corresponding depletion region in FIG. 7 has substantially reduced material defects therein, such as crystal dislocations, which can be electron-hole generation centers and generate unwanted leakage current.

The source and drain regions 33, 35, and 37 of the transistors (21, 15, and 17) are doped n+ in a conventional manner. The source and drain region 33 includes a contact 19 to provide a connection to voltage $V_{DD}$.

The n+ source region 25 of the reset transistor 21 is configured to contact the photodiode 11 by forming the source region 25 within the n-well photodiode area 310, as a shallow n+ well in the relatively deeper n-well region 310. By locating the source region 25 within the n-well photodiode area 310, the portion 28 of the n-well photodiode area 310 extends partially under a portion of the gate of the reset transistor 21, thereby effectively surrounding the n+ dopant source region 25 by a deeper n-well region. This deeper n-well region forms a tub region around the n+ dopant source region 25.

As noted above, the oxide layer which overlays all these regions is thinner at regions of concentrated dopant, such as the n+ dopant source region 25, thereby forming a step in the oxide layer when the oxide layer transitions from region of relatively low dopant concentration to a region having a higher concentration of dopant. This step causes material defects, such as crystal dislocations, which generate unwanted leakage current when the dislocations are formed in the depletion region.

In other words, the oxide layer of FIG. 7 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

Figure 8:
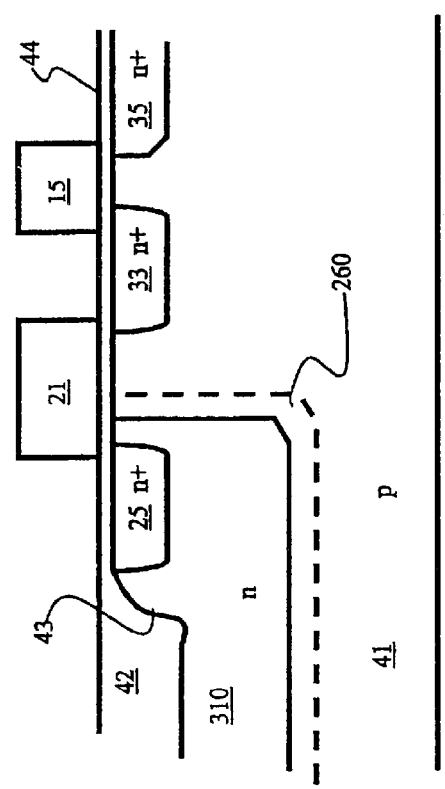
FIG. 8 is a cross-sectional view of the CMOS fabrication process layout taken at the section 29 of FIG. 7.

By forming a tub region from the n-well photodiode area 310 around the n+ dopant source region 25, the present invention is able to isolate the formation of the crystal dislocations in an area of the substrate that is not associated with the depletion region of the n-well photodiode area 310 and the substrate. FIG. 8 illustrates this isolation feature in more detail.

It is noted that FIG. 8 illustrates the situation when the reset transistor 21 is OFF and the photodiode region 310 is accumulating charge therein. When the reset transistor 21 is ON, there is no depletion region due to the voltage bias generated by the reset transistor 21.

As illustrated in FIG. 8, the depletion region 260 between the n-well photodiode area 310 and the p-type substrate 41 is at an effective distance away from the step 43 between the oxide layer regions 42 (thick layer) and 44 (thin layer). With this arrangement, the location of the depletion region 260 is located effectively away from the crystal dislocation region associated with step 43, and therefore, the dislocations cannot generate leakage current. In other words, when the height or thickness of the oxide layer across a depletion region is not constant, dislocations are formed which cause leakage current to be generated. The present invention, as illustrated in FIG. 8, provides for the height or thickness of the oxide layer to be constant across a depletion region so as to effectively or substantially reduce dislocations and the associated leakage current.

Figure 3:
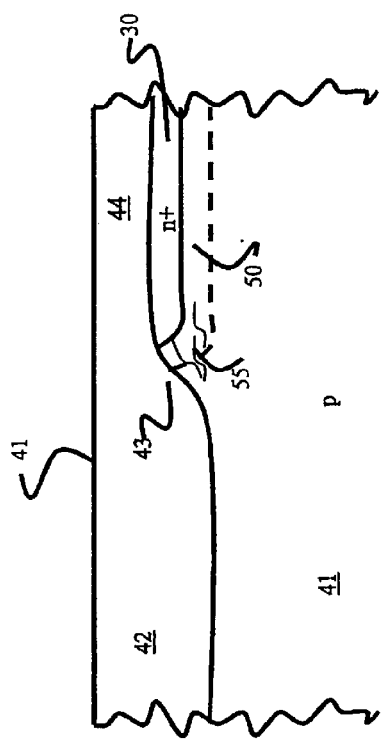
FIG. 3 is a cross-sectional view of the conventional CMOS fabrication process layout taken at the section 3 of FIG. 2.

As noted above, the oxide step 43 does not cause effective current leakage or defective pixels. The diffusion of the n-well photodiode area 310 is relatively deep, e.g., about 1 $\mu$m. As a result, the surface P-N junction and depletion region 260 formed with the p-type substrate 41 at the horizontal side of the n-well photodiode area 310 are not located (in the same manner as illustrated in FIG. 3) at the oxide step 43. Crystal dislocations formed at the substrate surface in the area of the oxide step 43 cannot, in general, extend to the surface P-N junction and corresponding depletion region 260 resulting from the use of the n-well photodiode area 310 according to the concepts of the present invention.

Moreover, the P-N junction and depletion region 260 formed with the p-type substrate 41 at the vertical bottom of the n-well photodiode area 310 are far below the substrate surface at the location of the oxide step 43. Crystal dislocations formed at the substrate surface in the area of the oxide step 43 cannot, in general, extend to the deeper P-N junction and corresponding depletion region 260 resulting from the use of the n-well photodiode area 310 according to the concepts of the present invention.

Thus, as illustrated in FIG. 8, the crystal dislocations associated with oxide step 43 are formed at a location that is substantially too far from the P-N junction and depletion region 260 for effective leakage current to be generated.

The thin-thick oxide step 43 around the n+ dopant source region 25 is within the n-well photodiode area 310, away from the perimeter of the n-well photodiode area 310, and therefore is away from locations at which the depletion region 260 between the n-well photodiode area 310 and the p-type substrate 41 are near to the substrate surface. As a result, the n+ dopant source region 25 doping produces no effective dislocation-induced leakage current.

In summary, there is no oxide step across the boundary between the p-type substrate 41 and the n-well photodiode area 310 and thus stress-induced dislocations are substantially reduced in the surface of the substrate at the location of the depletion region between the photodiode well 310 and the substrate 41. The boundary of the n+ dopant source region 25 with the gate of the reset transistor 21 likewise has no oxide step because the n+ source diffusion results in a thin gate oxide rather than thick oxide. Thus, at every point around the perimeter of the n-well photodiode area 310, including that section of perimeter associated with, i.e., near to, the n+ dopant source region 25, the overlaying oxide layer thickness is substantially constant, moving across the boundary of the perimeter, thereby effectively eliminating any oxide step across the boundary that could induce dislocations in the substrate.

As explained above, the photodiode area 310 adjacent to the gate of the reset transistor 21 can result in an n-well region that extends partially under the gate area of the reset transistor 21, thereby effectively shortening the channel of the transistor. If this is a concern for a given application, it can be preferred, as shown in FIGS. 7 through 10, to provide a gate of a length larger than that conventionally employed. This larger gate length can compensate for the n-well region extent into the gate region such that the transistor channel is maintained at a specified minimum length or greater. The larger gate length can also effectively compensate for the misalignment between the n-well and the gate area.

Another feature of the present invention as illustrated in FIG. 7, is the shape of the n-well photodiode area 310. As illustrated in FIG. 7, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

It is noted that FIG. 7 is an example of where n+ dopant source region 25, a terminal of the reset transistor 21, is formed within the photodiode 11 so that an electrical connection is provided between the photodiode 11 and the n+ dopant source region 25, and the step associated with the n+ dopant source region 25 is not associated with the depletion region of the n-well photodiode area 310 and the substrate 41.

As also illustrated in FIG. 7, according to the concepts of the present invention, the pixel's sense node contact 400 is provided in the n-well photodiode area 310. Thus, the n-well photodiode area 310 is itself the sense node region, together with the reset transistor source 25.

Figure 9:
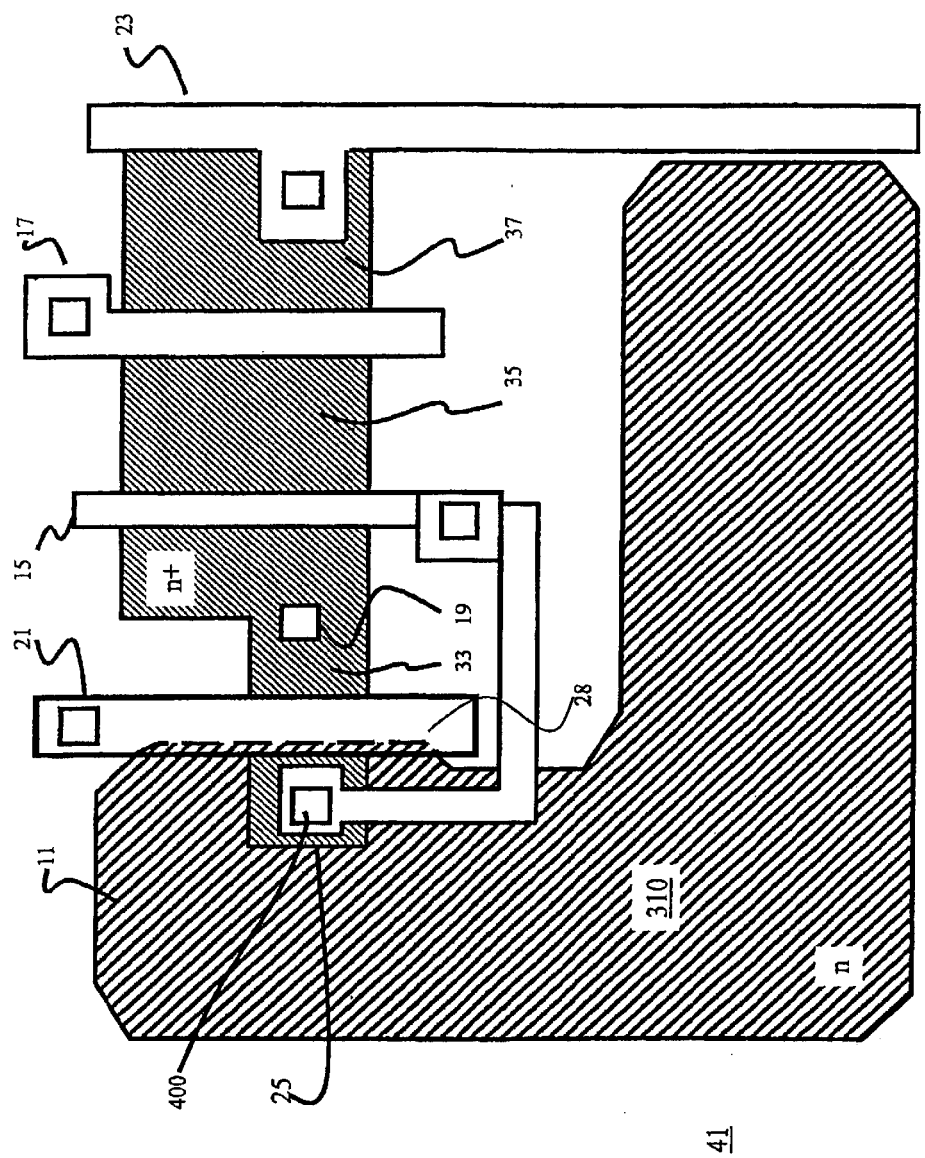
FIG. 9 is another embodiment of a CMOS fabrication process layout for a pixel according to the concepts of the present invention.

In accordance with the present invention, the contact 400 between the gate of the source follower transistor 15 and the sense node can be made at any point in the n-well photodiode area 310, either within the reset transistor source region 25, as illustrated in FIG. 9, or the n-well photodiode area 310, as illustrated in FIG. 7.

As illustrated in FIG. 7, according to the concepts of the present invention, the sense node contact 400 is not located at the perimeter or boundary of the photodiode area 310, but instead, the sense node contact 400 is located at some point away from the perimeter of the photodiode area 310. In order to ensure sufficient ohmic contact between the metal of the sense node contact 400 and the photodiode area 310, it is preferred that an n+ region 27 be provided surrounding the sense node contact 400. This n+ region 27 would preferably extend under and beyond sense node contact 400. While not required, the n+ region 27 can be preferred for most applications.

The n+ region 27 can be formed simultaneously with the source and drain regions (25, 33, 35, and 37) of the pixel transistors and thus no additional fabrication steps need to be added to a standard CMOS fabrication process.

Given that n+ region 27 doping is carried out simultaneously with the n+ transistor source and drain doping, the n+ region 27 is covered by the thin gate oxide rather than the thick field oxide. However, similar to the situation described above with respect to FIG. 8, the surrounding photodiode area 310 is covered with the thick field oxide. As a result, a thin-thick oxide step exists along the perimeter of the n+ region 27 inside the n-well photodiode area 310.

As noted above, the oxide step associated with the n+ region 27 does not cause effective current leakage or defective pixels. The diffusion of the n-well photodiode area 310 is relatively deep, e.g., about 1 µm. As a result, the P-N junction and depletion region formed with the p-type substrate 41 at the horizontal side of the n-well photodiode area 310 are not located at the oxide step associated with the n+ region 27. Crystal dislocations formed at the substrate surface in the area of the oxide step associated with the n+ region 27 cannot, in general, extend to the surface P-N junction and corresponding depletion region resulting from the use of the n-well photodiode area 310 according to the concepts of the present invention.

Moreover, the P-N junction and depletion region formed with the p-type substrate 41 at the vertical bottom of the n-well photodiode area 310 are far below the substrate surface at the location of the oxide step associated with the n+ region 27. Crystal dislocations formed at the substrate surface in the area of the oxide step associated with the n+ region 27 cannot, in general, extend to the deeper P-N junction and corresponding depletion region resulting from the use of the n-well photodiode area 310 according to the concepts of the present invention.

Thus, the crystal dislocations associated with oxide step associated with the n+ region 27 of FIG. 7 are formed at a location that is substantially too far from the P-N junction and depletion region for effective leakage current to be generated.

In the embodiment illustrated by FIG. 7, the dopant-concentrated region 27 is positioned within the doped well region 310 such that the doped well region 310 completely surrounds the dopant-concentrated region 27, and any transition regions causing stress-induced dislocations in the oxide layer are not located at the depletion region 260 formed around the perimeter of the doped well region 310. In other words, any transition regions causing stress-induced dislocations in the oxide layer are located in an area that is outside the depletion region formed around the perimeter of the doped well region 310.

As illustrated in FIG. 9, according to the concepts of the present invention, the sense node contact 400 is not located at the perimeter or boundary of the photodiode area 310, but instead, the sense node contact 400 is located in the reset transistor source region 25.

In the same manner as described above with respect to FIG. 7, the reset transistor source region 25 of FIG. 9 is located within the photodiode 11 such that a portion 28 of the photodiode area 310 is extended partially under the gate of the reset transistor 21 so as to substantially surround the reset transistor source region 25 in a deep well region. The photodiode area 310 is covered with the thick field oxide. As a result, a thin-thick oxide step exists along one perimeter of reset transistor source region 25 inside the n-well photodiode area 310.

As noted above, the oxide step associated with the reset transistor source region 25 of FIG. 9 does not cause effective current leakage or defective pixels. The diffusion of the n-well photodiode area 310 is relatively deep, e.g., about 1 $\mu$m. As a result, the P-N junction and depletion region formed with the p-type substrate 41 at the vertical bottom of the n-well photodiode area 310 are far below the substrate surface at the location of the oxide step associated with the reset transistor source region 25. These crystal dislocations formed at the substrate surface in the area of the oxide step associated with the reset transistor source region 25 cannot, in general, extend to the deeper P-N junction resulting from the use of the n-well photodiode area 310 according to the concepts of the present invention.

Also, the thin-thick oxide step associated with the reset transistor source region 25 of FIG. 9 is within the n-well photodiode area 310, away from the perimeter of the n-well photodiode area 310, and therefore is away from locations at which the P-N junction and depletion region between the n-well photodiode area 310 and the p-type substrate 41 are near to the substrate surface. As a result, the reset transistor source region 25 doping produces no effective dislocation-induced leakage current.

In other words, the oxide layer of FIG. 9 has a varying height such that a height of the oxide layer associated with the well region of the photodiode 310 is thicker than a height of the oxide layer associated with the terminal 25. The oxide layer includes a step region wherein the step region is formed where the height of the oxide layer transitions from the height associated with the photodiode well region 310 to the height associated with the terminal 25. The oxide layer has a constant height across a perimeter of the well region of the photodiode 310 that forms a depletion region with the substrate 41 when a reverse bias voltage is applied across the substrate layer 41 and the well region of the photodiode 310.

In this embodiment, the dopant-concentrated region 25 is positioned within the doped well region 310 such that the doped well region 310 completely surrounds the dopant-concentrated region 25 and a portion of the doped well region 310 extends partially under the gate of the reset transistor 21, thereby any transition regions causing stress-induced dislocations in the oxide layer are not located at the depletion region formed around the perimeter of the doped well region 310. In other words, the transition regions causing stress-induced dislocations in the oxide layer are located in an area that is outside the depletion region formed around the perimeter of the doped well region 310.

With respect to FIGS. 7 and 9, in accordance with the concepts of the present invention, the source and drain geometries of the various pixel transistors can be tailored to meet the performance specifications for each transistor. For example, the source and drain regions can be made wider for the source-follower transistor 15 and row select transistor 17, to enable higher driving capabilities of the transistors.

As illustrated in FIGS. 7 and 9, with respect to the boundaries of the other n+ source/drain regions (33, 35, and 37) with the substrate, these boundaries have oxide steps associated therewith, but the current produced therefrom is not a problem. It is only the current produced at regions having the same dopant type and the same electrical potential as the photodiode that is the problem.

It is noted that FIG. 9 is another example of where n+ dopant source region 25, a terminal of the reset transistor 21, is formed within the photodiode 11 so that an electrical connection is provided between the photodiode 11 and the n+ dopant source region 25, and the step associated with the n+ dopant source region 25 is not associated with the depletion region of the n-well photodiode area 310 and the substrate.

Another feature of the present invention as illustrated in FIG. 9, is the shape of the n-well photodiode area 310. As illustrated in FIG. 9, the n-well photodiode area 310 has no right angles included in the geometry of the n-well photodiode area 310. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 are obtuse angles.

Figure 10:
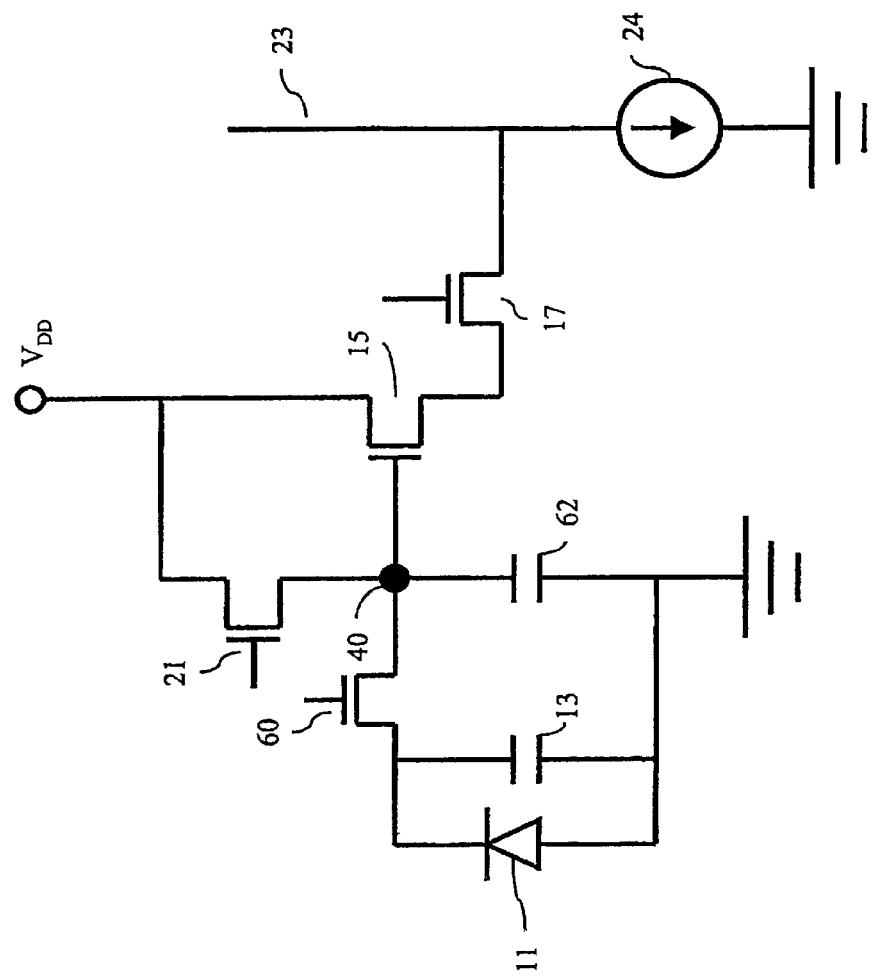
FIG. 10 a conventional circuit diagram of a CMOS pixel with a cascode transistor.

FIG. 10 illustrates an additional pixel circuit example addressed by the layout design of the present invention. In this configuration, a cascode transistor 60 is provided between the pixel photodiode 11 and the reset transistor 21. This cascode transistor 60 acts to further reduce the sense capacitance of the pixel, thereby increasing the sensitivity of the pixel. The sense node 40 of the pixel is in this design not at the photodiode 11 but instead at the junction between the output of the cascode transistor 60 and the source of the reset transistor 21. A parasitic capacitance 62 associated with the sense node 40 is represented in the pixel design as a capacitor element in the manner of the photodiode parasitic capacitance 13. The source follower transistor 15 and row select transistor 17 operate in the manner of the pixel design of FIG. 1.

Figure 11:
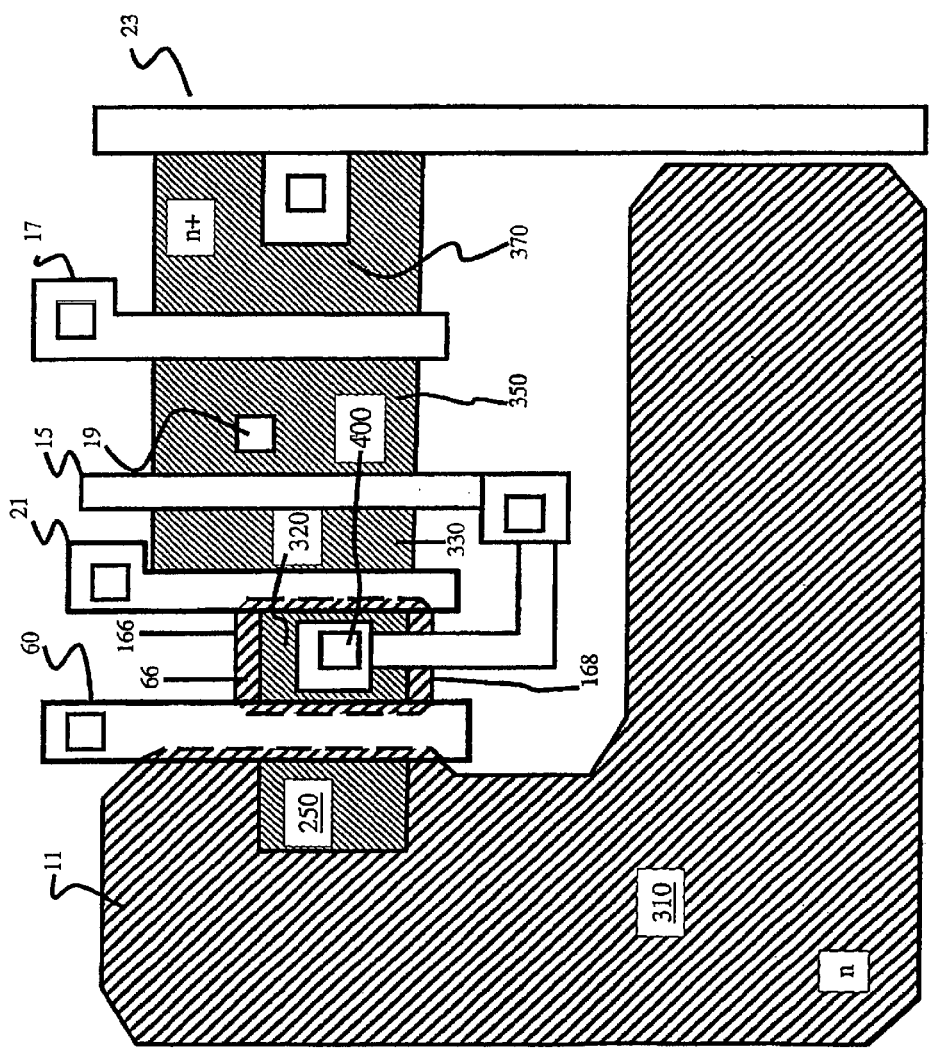
FIG. 11 is an embodiment of a CMOS fabrication process layout for the CMOS pixel of FIG. 10 according to the concepts of the present invention.

FIG. 11 illustrates a layout for the CMOS pixel of FIG. 10 according to the concepts of the present invention. Like the pixel layouts of FIGS. 7 and 9, the pixel layout of FIG. 11 employs an n-well photodiode area 310. The source 250 of the cascode transistor 60 is formed by an n+ shallow diffusion within the n-well photodiode area 310. As with FIGS. 7 and 9, the source 250 of the cascode transistor 60 is located such that a portion of the n-well photodiode area 310 substantially surrounds the source 250 and partially extends under a portion of the gate of the cascode transistor 60. As a result, a thin-thick oxide step exists along one perimeter of reset transistor source region 250 inside the n-well photodiode area 310.

As noted above, the oxide step associated with the source region 250 does not cause effective current leakage or defective pixels. The diffusion of the n-well photodiode area 310 is relatively deep, e.g., about 1 μm. As a result, the P-N junction and depletion region formed with the p-type substrate 41 at the vertical bottom of the n-well photodiode area 310 are far below the substrate surface at the location of the oxide step associated with the source region 250. These crystal dislocations formed at the substrate surface in the area of the oxide step associated with the source region 250 cannot, in general, extend to the deeper P-N junction resulting from the use of the n-well photodiode area 310 according to the concepts of the present invention.

Also, the thin-thick oxide step associated with the source region 250 is within the n-well photodiode area 310, away from the perimeter of the n-well photodiode area 310, and therefore is away from locations at which the P-N junction and depletion region between the n-well photodiode area 310 and the p-type substrate 41 are near to the substrate surface. As a result, the source region 250 doping produces no effective dislocation-induced leakage current.

This n+ source region 250 is preferably formed simultaneously with the n+ source and drain regions (310, 330, 350, and 370) of the other pixel transistors and thus no additional fabrication steps need to be added to a standard CMOS fabrication process. The source and drain region 350 includes a contact 19 to provide a connection to voltage $V_{DD}$.

A thin gate oxide covers the surface of the substrate at the location of the n+ cascode source 250 in a similar manner to the reset transistor source region 25 as illustrated in FIG. 8. This thin oxide extends across the source boundary to the channel region under the gate of the cascode transistor 60, and therefore is of a constant oxide height in accordance with the concepts of the present invention.

The n-well photodiode area 310 is preferably formed simultaneously with n-wells formed in the substrate for PMOS circuitry and thus no additional fabrication steps need to be added to a standard CMOS fabrication process.

At all sections of the perimeter of the n-well photodiode area 310 other than the region of the cascode source 250, a thick field oxide covers the substrate, and is of constant height across the boundary of the perimeter. Stress-induced substrate dislocations that could produce pixel leakage current are therefore eliminated at these points.

In the manner of the reset source region 25 in the pixel layout of FIG. 8, the cascode transistor source region 250 presents an oxide height step at the boundary of the n+ source diffusion in the n-well photodiode area 310. As explained above, this boundary is not at the perimeter of the n-well photodiode area 310, where the P-N junction and depletion region approaches the substrate surface, and thus, any dislocations at this boundary do not contribute to leakage current.

As illustrated in FIG. 11, the sense node contact 400 is located at the drain/source connection region 320 between the cascode transistor 60 and the reset transistor 21. The drain/source connection region 320 defines the drain of the cascode transistor 60 and the source of the reset transistor 21 and thus is an n+ substrate region in which a thin gate oxide covers the substrate. The edges of the drain/source connection region 320 between the two gates of the transistors 60 and 21 that would normally form the boundary between the drain/source connection region 320 and the field area 41 are bounded by the thick field oxide. As a result, dislocations can form at near-surface substrate locations and contribute leakage current to the pixel signal measured at the sense node contact 400.

In accordance with the concepts of the present invention, this undesirable condition is eliminated by providing an n-type well region 66 around the edges of the drain/source region 320. Preferably, the n-type well region 66 is produced simultaneously with the n-well formation in the substrate and thus no additional fabrication steps need to be added to a standard CMOS fabrication process. As a result, a thin-thick oxide step exists along one perimeter of reset transistor source region 320 inside the n-well region 66.

As noted above, the oxide step associated with the source region 320 does not cause effective current leakage or defective pixels. The diffusion of the n-well region 66 is relatively deep, e.g., about 1 μm. As a result, the P-N junction and depletion region formed with the p-type substrate 41 at the vertical bottom of the n-well region 66 are far below the substrate surface at the location of the oxide step associated with the source region 320. These crystal dislocations formed at the substrate surface in the area of the oxide step associated with the source region 320 cannot, in general, extend to the deeper P-N junction resulting from the use of the n-well region 66 according to the concepts of the present invention.

Also, the thin-thick oxide step associated with the source region 320 is within the n-well region 66, away from the perimeter of the n-well region 66, and therefore is away from locations at which the P-N junction and depletion region between the n-well region 66 and the p-type substrate 41 are near to the substrate surface. As a result, the source region 320 doping produces no effective dislocation-induced leakage current.

In other words, the oxide layer of FIG. 11 has a varying height such that a height of the oxide layer associated with the well region of the photodiode 310 is thicker than a height of the oxide layer associated with the terminals 250 and 320. The oxide layer includes a step region wherein the step region is formed where the height of the oxide layer transitions from the height associated with either the photodiode well region 310 or terminal well region 66 to the height associated with the terminals 250 and 320. The oxide layer has a constant height across perimeters of the well regions 310 and 66 that form depletion regions with the substrate 41 when a reverse bias voltage is applied across the substrate layer 41 and the well regions 310 and 66.

The n+ source/drain region 320 can be provided in the conventional manner with the other source and drain regions and thus no additional fabrication steps need to be added to a standard CMOS fabrication process. With this configuration, the n+ source/drain region 320, having a thin oxide overlayer, extends only within the n-type region 66 having a thick field oxide. As a result, a step in oxide height from the thin gate oxide to the thicker field oxide occurs within the n-type well region 66. Across the boundaries 166 and 168 of the n-type well region 66, the oxide height is constant, at the field oxide thickness. Stress-induced dislocations are therefore not produced at the P-N junction formed with the substrate at the boundary of the edge regions 166 and 168, and in turn, dislocation-induced leakage current is not generated at these locations.

In the embodiment illustrated in FIG. 11, the dopant-concentrated source region 250 is positioned within the doped well region 310 such that the doped well region 310 completely surrounds the dopant-concentrated source region 250, and any transition regions causing stress-induced dislocations in the oxide layer are not located at the depletion region formed around the perimeter of the doped well region 310. In other words, the transition regions causing stress-induced dislocations in the oxide layer are located in an area that is outside the depletion region formed around the perimeter of the doped well region 310.

With respect to the boundaries of the other n+ source/drain region (330, 350, and 370) with the substrate, these boundaries have oxide steps associated therewith, but the current produced therefrom is not a problem. It is only the current produced at regions having the same electrical potential as the photodiode that is the problem.

It is noted that FIG. 11 is a further example of where n+ dopant source region 250, a terminal of the cascode transistor 60, is formed within the photodiode 11 so that an electrical connection is provided between the photodiode 11 and the n+ dopant source region 250, and the step associated with the n+ dopant source region 250 is not associated with the depletion region of the n-well photodiode area 310 and the substrate.

Another feature of the present invention as illustrated in FIG. 11, is the shape of the n-well photodiode area 310 and the n-type well region 66. As illustrated in FIG. 11, the n-well photodiode area 310 and the n-type well region 66 have no right angles included in their geometry. Instead, according to the concepts of the present invention, only non-right angled corners, e.g., large angle corners, rounded-off corners, or curves are provided, in order to avoid right or acute angle corners, whereby no geometric points for electric field concentration, and the possibility of increased leakage current, are produced. Preferably, the corners of the n-well photodiode area 310 and the n-type well region 66 are obtuse angles.

In summary, the present invention provides a CMOS pixel design that substantially eliminates dislocation-induced pixel leakage current and that correspondingly reduces pixel defect density caused by substrate dislocations. Furthermore, the present invention enables this enhancement without modification of standard CMOS fabrication processes.

More specifically, according to the concepts of the present invention, a dopant-concentrated region is positioned within a doped well region such that the doped well region completely surrounds the dopant-concentrated region, and any transition regions causing stress-induced dislocations in the oxide layer are not located at the depletion region formed around the perimeter of the doped well region. In other words, the transition regions causing stress-induced dislocations in the oxide layer are located in an area that is outside the depletion region formed around the perimeter of the doped well region.

The concepts of the present invention provide flexibility in the design paradigm of the pixel layout. For example, the photodiode region of a pixel and the pixel region at which a sense node contact is positioned to form a pixel sense node can be one and the same region, can be interconnected regions, or can be completely separate regions. Moreover, transistor source, drain, or other elements can be incorporated in the photodiode and/or sense node regions.

In any of these cases, in accordance with the present invention, the oxide layer on the substrate surface is provided of substantially constant height across the boundary of the region for both the photodiode and sense node regions, whether the regions are geometrically separated or provided by a common or overlapping region. It is the perimeter of these regions at the undoped substrate that is here referred to as the region boundary.

The pixel design paradigm of the present invention substantially reduces the production of stress-induced dislocations at the region boundaries, and thereby substantially reduces dislocation-induced leakage current at these regions.

Beyond the minimization of dislocation-induced leakage current, this pixel layout of the present invention provides additional advantages. The use of an n-type, rather than an n+ type, photodiode enhances the sensitivity of the pixel. Specifically, the lighter doped photodiode area results in a smaller depletion region capacitance than that associated with a more heavily doped area. For a given level of charge to be held by a pixel, a smaller depletion region capacitance produces a larger output signal voltage than would be produced by a larger depletion region capacitance. Thus, employing a more lightly doped photodiode area enhances the sensitivity of the pixel.

The n-type well region photodiode area further provides an advantage of improved pixel response to illumination of the wavelength corresponding to the color blue. Blue light has a rather shallow penetration depth into a silicon substrate. Thus, photocharge carriers generated in the photodiode region, in response to blue light, must travel through a large extent to reach the P-N junction of the photodiode.

A heavily-doped n+ photodiode is characterized by a relatively short charge carrier lifetime and a corresponding high degree of recombination. Therefore, a large fraction of the blue-light photocharge carriers recombine along the path to the P-N junction and thus do not produce a pixel response.

In contrast, the more lightly doped n-type photodiode region of the present invention is characterized by a longer charge carrier lifetime, whereby a larger fraction of photocharge carriers successfully reach the P-N junction before recombining, therefore contributing to the pixel response.

Furthermore, although the descriptions above used specific pixel circuit configuration, the concepts of the present invention are not limited to a particular pixel circuit configuration.

Moreover, although the various descriptions above utilized an underlying substrate of a p-type region and the active areas of n-type regions, the concepts of the present invention can be applicable to pixel layouts where the underlying substrate is an n-type region and the active areas are p-type regions.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A semiconductor structure, comprising:
   a substrate layer of a first dopant type;
   a doped well region provided within said substrate layer, said doped well region being of a second dopant type;
   a transistor formed by a source, a drain, and a gate located between said source and drain;
   said source of said transistor being provided within said doped well region, said source of said transistor being of said second dopant type and of a dopant concentration greater than a dopant concentration of said doped well region; and an oxide layer formed directly on said substrate layer, said doped well region, and said source of said transistor;

said oxide layer having a varying height such that a height of said oxide layer associated with said doped well region is thicker than a height of said oxide layer associated with said source of said transistor;

said oxide layer including a step region, said step region being located where said height of said oxide layer transitions from said height associated with said doped well region to said height associated with said source of said transistor;

said oxide layer having a constant height across a perimeter of said doped well region that forms a depletion region with said substrate when a reverse bias voltage is applied across said substrate layer and said doped well region.

2. The semiconductor structure as claimed in claim 1, wherein said first dopant type is p-type, said second dopant type is n-type, and said dopant of said source of said transistor is an n+ dopant.

3. The semiconductor structure as claimed in claim 1, wherein said first dopant type is n-type, said second dopant type p-type, and said dopant of said source of said transistor is a p+ dopant.

4. The semiconductor structure as claimed in claim 1, wherein said oxide layer is silicon dioxide.

5. The semiconductor structure as claimed in claim 1, wherein said substrate is silicon.

6. The semiconductor structure as claimed in claim 1, wherein said doped well region is of a predetermined shape having a multitude of corners, a plurality of corners of said doped well region being non-right angles.

7. The semiconductor structure as claimed in claim 1, wherein said doped well region is of a predetermined shape having a multitude of corners, a plurality of corners of said doped well region being obtuse angles.

8. A pixel site of a semiconductor imager structure, comprising:

a substrate layer of a first dopant type;

a photodiode being formed of a doped well region within said substrate layer, said doped well region being of a second dopant type;

a transistor formed by a source, a drain, and a gate located between said source and drain;

said source of said transistor being provided within said doped well region of said photodiode, said source of said transistor being of said second dopant type and of a dopant concentration greater than a dopant concentration of said doped well region of said photodiode; and an oxide layer formed directly on said substrate layer, said doped well region of said photodiode, and said source of said transistor;

said oxide layer having a varying height such that a height of said oxide layer associated with said doped well region of said photodiode is thicker than a height of said oxide layer associated with said source of said transistor;

said oxide layer including a step region, said step region being located where said height of said oxide layer transitions from said height associated with said doped well region of said photodiode to said height associated with said source of said transistor;

said oxide layer having a constant height across a perimeter of said doped well region of said photodiode that forms a depletion region with said substrate when a reverse bias voltage is applied across said substrate layer and said doped well region of said photodiode.

9. The pixel site as claimed in claim 8, further comprising a sense node contact connected to said photodiode and said transistor, said sense node contact being provided within said doped well region of said photodiode.

10. The pixel site as claimed in claim 8, wherein said first dopant type is p-type, said second dopant type is n-type, and said dopant of said source of said transistor is an n+ dopant.

11. The pixel site as claimed in claim 8, wherein said first dopant type is n-type, said second dopant type p-type, and said dopant of said source of said transistor is a p+ dopant.

12. The pixel site as claimed in claim 8, wherein said transistor includes a source terminal, a drain terminal, and a gate, said source terminal being said source of said transistor within doped well region of said photodiode.

13. The pixel site as claimed in claim 8, wherein said doped well region of said photodiode is of a predetermined shape having a multitude of corners, a plurality of said corners of said well region of said photodiode being non-right angles.

14. The pixel site as claimed in claim 8, wherein said doped well region of said photodiode is of a predetermined shape having a multitude of corners, a plurality of said corners of said well region of said photodiode being obtuse angles.

15. A pixel site of a semiconductor imager structure, comprising:

a photodiode formed in a substrate layer of a first dopant type;

a first transistor formed by a source, a drain, and a first gate located between said source and said drain, said first transistor being connected to said photodiode;

a second transistor formed by a second source a second drain, and a second gate located between said second source and said second drain, said second transistor being connected to said first transistor;

a sense node contact connected to said first and second transistors; and an oxide layer;

said photodiode being provided as a well region formed within said substrate layer, said well region of said photodiode being of having a second dopant type;

said source of said first transistor being provided within said well region of said photodiode, said source of said first transistor being of said second dopant type and of a dopant concentration greater than a dopant concentration of said well region of said photodiode;

said oxide layer formed directly on said substrate layer, said well region of said photodiode, and said source of said first transistor;

said oxide layer having a varying height such that a height of said oxide layer associated with said well region of said photodiode is thicker than a height of said oxide layer associated with said source of said first transistor;

said oxide layer including a step region, said step region being located where said height of said oxide layer transitions from said height associated with said well region of said photodiode to said height associated with said source of said first transistor;

said oxide layer having a constant height across a perimeter of said well region of said photodiode that forms a depletion region with said substrate when a reverse bias voltage is applied across said substrate layer and said well region of said photodiode.

16. The pixel site as claimed in claim 15, wherein said drain of said first transistor and said second source of said second transistors form a common drain/source terminal, said common drain/source terminal being of said second dopant type and being provided within a terminal well region, said common drain/source terminal being of a dopant concentration greater than a dopant concentration of said terminal well region;
said oxide layer being provided over said common drain/source terminal and said terminal well region such that a height of said oxide layer associated with said terminal well region is thicker than a height of said oxide layer associated with said common drain/source terminal;
said oxide layer having a constant height across a perimeter of said terminal well region that forms a depletion region with said substrate when a reverse bias voltage is applied across said substrate layer and said terminal well region.

17. The pixel site as claimed in claim 16, further comprising a sense node contact connected to said first and second transistors, said sense node contact being provided within said common drain/source terminal.

18. The pixel site as claimed in claim 15, wherein said first dopant type is p-type and said second dopant type is n-type dopant.

19. The pixel site as claimed in claim 15, wherein said first dopant type is n-type, and said second dopant type is p-type.

20. The pixel site as claimed in claim 15, wherein said well region of said photodiode is of a predetermined shape having a multitude of corners, a plurality of said corners of said well region being non-right angles.

21. The pixel site as claimed in claim 15, wherein said well region of said photodiode is of a predetermined shape having a multitude of corners, a plurality of said corners of said well region being obtuse angles.

22. The pixel site as claimed in claim 16, wherein said terminal well region is of a predetermined shape having a multitude of corners, a plurality of said corners of said second well region being non-right angles.

23. The pixel site as claimed in claim 16, wherein said terminal well region is of a predetermined shape having a multitude of corners, a plurality of said corners of said well region being obtuse angles.

24. A semiconductor imager structure, comprising:
a substrate layer of a first dopant type;
a photodiode, said photodiode region being provided as a well region formed within said substrate layer, said well region of said photodiode being of having a second dopant type;
a transistor electrically connected to said photodiode and having a terminal that has a same electrical potential as said photodiode, said terminal of said transistor being of said second dopant type and of a dopant concentration greater than a dopant concentration of said well region of said photodiode; and
an oxide layer;
said well region of said photodiode having an extended portion so that at least a portion of said terminal of said transistor having the same electrical potential as said photodiode is formed within said extended portion of said well region of said photodiode;
said oxide layer formed directly on said substrate layer, said well region of said photodiode, and said terminal of said transistor;
said oxide layer having a varying height such that a height of said oxide layer associated with said well region of said photodiode is thicker than a height of said oxide layer associated with said terminal of said transistor;
said oxide layer including a step region, said step region being located where said height of said oxide layer transitions from said height associated with said well region of said photodiode to said height associated with said terminal of said transistor;
said oxide layer having a constant height across a perimeter of said well region of said photodiode that forms a depletion region with said substrate when a reverse bias voltage is applied across said substrate layer arid said well region of said photodiode;
wherein a portion of said terminal of said transistor having the same electrical potential as said photodiode is formed within said extended portion of said well region of said photodiode and a remaining portion of said terminal of said transistor having the same electrical potential as said photodiode is formed within a non-extended portion of said well region of said photodiode.

25. The semiconductor imager structure as claimed in claim 24, wherein said first dopant type is p-type and said second dopant type is n-type.

26. The semiconductor imager structure as claimed in claim 24, wherein said first dopant type is n-type and said second dopant type is p-type.

27. The semiconductor imager structure as claimed in claim 24, wherein said well region of said photodiode is of a predetermined shape having a multitude of corners, a plurality of said corners of said well region of said photodiode being non-right angles.

28. The semiconductor imager structure as claimed in claim 24, wherein said extended portion of said well region of said photodiode is of a predetermined shape having a multitude of corners, a plurality of said corners of said well region of said photodiode being non-right angles.

29. The semiconductor imager structure as claimed in claim 24, further comprising a sense node contact provided within said well region of said photodiode.

30. A pixel site of a semiconductor imager structure, comprising:
a photodiode formed in a substrate layer of a first dopant type; and
a transistor connected to said photodiode;
said photodiode being provided as a well region within said substrate layer, said well region being of a second dopant type, wherein a depletion region is formed around a perimeter of said well region when a reverse bias voltage is applied across said substrate layer and said well region;
said transistor including a source, a drain, and a gate;
said source being provided as a region of source dopant within said well region;
said source dopant being of said second dopant type and of a dopant concentration that is higher than a dopant concentration of said well;
said gate extending over a portion of said well region located between said source and drain regions;
said drain region being formed within a second well region and a sense node contact for said photodiode is provided within said second well region.

31. The pixel site as claimed in claim 30, wherein said first dopant type is p-type, said second dopant type n-type, and said source dopant is an n+ dopant.

32. The pixel site as claimed in claim 30, said first dopant type is n-type, said second dopant type is p-type, and said source dopant is a p+ dopant.

33. The pixel site as claimed in claim 30, wherein a sense node contact for the photodiode is provided within said well region of said photodiode.

34. The pixel site as claimed in claim 30, wherein said well region is of a predetermined shape having a multitude of corners, a plurality of said corners of said well region being non-right angles.

35. The pixel site as claimed in claim 30, wherein said well region is of a predetermined shape having a multitude of corners, a plurality of said corners of said well region being obtuse angles.

36. The pixel site as claimed in claim 35, wherein said drain dopant is an n+ dopant and said second well region is of an n-type dopant.

37. The pixel site as claimed in claim 30, wherein said drain dopant is a p+ dopant and said second well region is of a p-type dopant.

* * * * *